(12) United States Patent

Hung et al.

(10) Patent No.: US 8,013,436 B2
(45) Date of Patent: Sep. 6, 2011

(54) HEAT DISSIPATION PACKAGE STRUCTURE AND METHOD FOR FABRICATING THE SAME

(75) Inventors: Min-Shun Hung, Taichung Hsien (TW); Yo-Yi Tsai, Taichung (TW); Chien-Ping Huang, Taichung (TW); Cheng-Hsu Hsiao, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 702 days.

(21) Appl. No.: 12/157,831

(22) Filed: Jun. 13, 2008

(65) Prior Publication Data

US 2008/0308926 A1 Dec. 18, 2008

(30) Foreign Application Priority Data

Jun. 13, 2007 (TW) ................ 96121275 A

(51) Int. Cl.
*H01L 23/34* (2006.01)
(52) U.S. Cl. .............. 257/706; 257/712; 257/E23.116
(58) Field of Classification Search .......... 257/706, 257/712, E23.116
See application file for complete search history.

(56) References Cited

U.S. PATENT DOCUMENTS

| | | | |
|---|---|---|---|
| 5,450,283 A | 9/1995 | Lin et al. | |
| 6,020,221 A * | 2/2000 | Lim et al. | 438/125 |
| 6,140,707 A * | 10/2000 | Plepys et al. | 257/778 |
| 6,444,498 B1 | 9/2002 | Huang et al. | |
| 6,458,626 B1 | 10/2002 | Huang et al. | |
| 6,699,731 B2 | 3/2004 | Huang et al. | |
| 7,190,062 B1 * | 3/2007 | Sheridan et al. | 257/686 |
| 7,893,546 B2 * | 2/2011 | Zhao et al. | 257/784 |
| 2006/0103014 A1 * | 5/2006 | Huang et al. | 257/712 |
| 2007/0296079 A1 * | 12/2007 | Huang et al. | 257/712 |
| 2008/0122071 A1 * | 5/2008 | Tseng et al. | 257/720 |

* cited by examiner

*Primary Examiner* — Benjamin Sandvik
*Assistant Examiner* — Krista Soderholm
(74) *Attorney, Agent, or Firm* — Peter F. Corless; Steven M. Jensen; Edwards Angell Palmer & Dodge LLP

(57) ABSTRACT

A heat dissipation package structure and method for fabricating the same are disclosed, which includes mounting and electrically connecting a semiconductor chip to a chip carrier through its active surface; mounting a heat dissipation member having a heat dissipation section and a supporting section on the chip carrier such that the semiconductor chip can be received in the space formed by the heat dissipation section and the supporting section, wherein the heat dissipation section has an opening formed corresponding to the semiconductor chip; forming an encapsulant to encapsulate the semiconductor chip and the heat dissipation member; and thinning the encapsulant to remove the encapsulant formed on the semiconductor chip to expose inactive surface of the semiconductor chip and the top surface of the heat dissipation section from the encapsulant. Therefore, the heat dissipation package structure is fabricated through simplified fabrication steps at low cost, and also the problem that the chip is easily damaged in a package molding process of the prior art is overcome.

7 Claims, 5 Drawing Sheets

HEAT DISSIPATION PACKAGE STRUCTURE AND METHOD FOR FABRICATING THE SAME

BACKGROUND OF THE INVENTION

1. Field of the Invention

This invention generally relates to a semiconductor package structure and method for fabricating the same, and more specifically, to a heat dissipation semiconductor package structure that provides semiconductor chip with efficient heat dissipation path and method for fabricating the same.

2. Description of Related Art

In order to protect semiconductor chips of conventional semiconductor packages from being contaminated by external water and dust, the semiconductor chips are encapsulated with an encapsulant for insulation purpose. However, as the encapsulant made of a package resin has poor heat conductivity, thermal conductivity coefficient of which is around 0.8 w/m° K, heat generated during operation of the semiconductor chips cannot be efficiently dissipated to the outside via the encapsulant, thereby causing heat accumulation and dramatically and adversely affecting performance and lifetime of the semiconductor chips. Therefore, the idea of adding a heat dissipation member in a semiconductor package is conceived so as to enhance heat dissipation efficiency of the semiconductor package.

However, if the heat dissipation member is also completely encapsulated by the encapsulant, heat generated by a semiconductor chip still must pass through the encapsulant before being dissipated to the outside. Accordingly, there is quite limited improvement in heat dissipation efficiency, and even worse, heat dissipation demand cannot be fulfilled. Therefore, one approach to efficiently dissipate heat generated by a semiconductor chip is to completely expose the heat dissipation member from the encapsulant, and another approach is to directly expose surface of a semiconductor chip from the encapsulant, thereby directly dissipating heat generated by the semiconductor chip via surface exposed to the air.

Please refer to FIG. 1A, which is a diagram of a semiconductor package disclosed by U.S. Pat. No. 5,450,283, wherein, surface of a semiconductor chip 11 of the semiconductor package 10 is directly exposed from an encapsulant 14 encapsulating the semiconductor chip 11. Since the top surface of the semiconductor chip 11 is exposed from the encapsulant 14 and directly contacts with the air, heat generated by the semiconductor chip 11 is capable of being dissipated directly to the air without the need of passing through the encapsulant 14, thus improving the heat dissipation efficiency.

However, referring to FIG. 1B, there are some disadvantages in fabricating the abovementioned semiconductor package 10. First, when the substrate 12 attached with the semiconductor chip 11 is disposed inside a mold cavity 15 of an encapsulation mold for a molding process to form the encapsulant 14, a tape 13 must be pre-adhered to the top wall of the mold cavity 15 such that the top surface of the semiconductor chip 11 can be abutted against the top wall of the mold cavity 15 through the tape 13 after the mold is closed, thereby avoiding flashing of the molding compound on the top surface of the semiconductor chip 11. However, if the overall height of the substrate 12 attached with the chip 11 is too low due to bad control of the attaching height of the semiconductor chip 11 on the substrate 12, the top surface of the semiconductor chip 11 cannot be efficiently abutted against the top wall of the mold cavity 15 through the tape 13 and therefore a gap is formed between the top surface of the semiconductor chip 11 and the top wall of the mold cavity 15. As a result, the molding compound for forming the encapsulant 14 will flash on the top surface of the semiconductor chip 11. As long as flash occurs on the top surface of the semiconductor chip 11, not only heat dissipation efficiency of the semiconductor chip 11 is decreased, but also appearance of finished product is adversely affected, Thus, a post process of deflashing is required to be performed, which however is time-consuming and increases the fabrication cost and can even lead to damage of finished product. On the other hand, if the overall height of the substrate 12 attached with the semiconductor chip 11 is too high, then pressing force of the semiconductor chip 11 abutting against the top wall of the mold cavity 15 through the tape 13 can be too strong, which can easily lead to crack of the semiconductor chip 11.

Meanwhile, closing force of the encapsulation mold is further transmitted to the semiconductor chip 13 through the tape 13, which also causes crack of the semiconductor chip 11. Therefore, yield of the finished products after encapsulation cannot be efficiently increased, and fabrication cost is difficult to be decreased.

In view of the abovementioned drawbacks of the prior art, U.S. Pat. No. 6,458,626, as shown in FIGS. 2A through 2C, No. 6,444,498, as shown in FIG. 3, and U.S. Pat. No. 6,699,731, as shown in FIG. 4, which are assigned to the same assignee as this application, disclose a semiconductor package with a heat dissipation member directly attached to a semiconductor chip without causing problem of flash or chip crack, or disclose a semiconductor package with surface of a semiconductor chip directly exposed to the air.

As shown in FIG. 2A, an interface layer 25 that has poor bonding with encapsulant is formed on surface of a heat dissipation member 21 to be exposed to the air. Then, the heat dissipation member 21 is attached on a semiconductor chip 20 on a substrate 23. Subsequently, a package molding process is performed so as to form an encapsulant 24 to completely encapsulate the heat dissipation member 21 and the semiconductor chip 20, and the encapsulant 24 also covers the interface layer 25 of the heat dissipation member 21. Therefore, mold cavity of the encapsulation mold used in the package molding process has a depth greater than the overall height of the semiconductor chip 20 and the heat dissipation member 21, consequently, the encapsulation mold will not contact the heat dissipation member 21 and accordingly crack of the semiconductor chip 20 caused by pressing force is avoided. Next, a cutting process is performed as shown in FIG. 2B, and also the encapsulant 24 on the heat dissipation member 21 is removed, wherein, if the bonding force between the interface layer 25, such as a gold plating layer, and the heat dissipation member 21 is greater than the bonding force between the interface layer 25 and the encapsulant 24, when the encapsulant 24 is removed, the interface layer 25 will be left on the heat dissipation member 21. Meanwhile, since the interface layer 25 has poor bonding with the encapsulant 24, no encapsulant residue is left on the interface layer 25, as shown in FIG. 2C, thereby avoiding the flash problem. On the other hand, if the bonding force between the interface layer 25, such as an adhesive tape made of a polyimide resin, and the heat dissipation member 21 is less than the bonding force between the interface layer 25 and the encapsulant 24, when the encapsulant 24 is removed, the interface layer 25 is removed together with the encapsulant 24, as shown in FIG. 3, which also avoids the flash problem.

Furthermore, as shown in FIG. 4, which is a cross-sectional diagram of one semiconductor package according to U.S. Pat. No. 6,699,731, wherein a metal cover sheet 33 with an interface layer 333 is formed on a semiconductor chip 31. The interface layer 333 has different coefficient of thermal expansion from molding compound for forming the encapsulant 34, as a result, the interface layer 333 of poor bonding nature will delaminate from the semiconductor chip 31 and the encapsulant 34 around the semiconductor chip 31. Therefore, the interface layer 333, the cover sheet 33, and the molding compound 340 on the cover sheet 33 can be easily peeled off from surfaces of the semiconductor chip 31 and encapsulant 34 around the semiconductor chip 31, thereby exposing surface of the semiconductor chip 31 from the encapsulant 34 and directly dissipating heat generated by the semiconductor chip 31 to the air through the exposed surface. In addition, in the package molding process, since surface of the semiconductor chip 31 is completely covered by the interface layer 333, no molding compound residual is left on the surface of the semiconductor chip 31, consequently there is no need to perform any post process for removing flash, thereby decreasing the package cost and ensuring a better appearance of finished product of the semiconductor package.

However, complicated process and high fabrication cost of the fabrication processes of semiconductor packages restrict their practical application in the semiconductor package industry.

Hence, it is a highly urgent issue in the industry for how to provide a heat dissipation package structure and method for fabricating the same that can prevent semiconductor chip from being damaged by press force during a package molding process and meanwhile has simple fabrication process and low cost.

SUMMARY OF THE INVENTION

In view of the disadvantages of the prior art, it is an objective of the present invention to provide a heat dissipation package structure and method for fabricating the same, which are capable of efficiently dissipating heat generated by semiconductor chip during operating.

It is another objective of the present invention to provide a heat dissipation package structure and method for fabricating the same, wherein, semiconductor chip will not be damaged due to pressing force during a package molding process.

It is a further objective of the present invention to provide a heat dissipation package structure and method for fabricating the same, which provide simple fabrication process at low cost.

To achieve the aforementioned and other objectives, a method for fabricating a heat dissipation package structure is provided according to the present invention. The method comprises: providing at least one semiconductor chip having an active surface and a relative inactive surface, mounting and electrically connecting the semiconductor chip to a chip carrier through its active surface; mounting a heat dissipation member on the chip carrier, wherein the heat dissipation member has a heat dissipation section, a supporting section extending downward from the heat dissipation section, and an opening formed in the heat dissipation section, the heat dissipation member is supported on the chip carrier through the supporting section, the semiconductor chip is received in the space formed by the heat dissipation section and the supporting section, and the opening of the heat dissipation section corresponds to top of the inactive surface of the semiconductor chip; performing a package molding process so as to form an encapsulant on the chip carrier to encapsulate the semiconductor chip and the heat dissipation member; and thinning the encapsulant on the semiconductor chip to expose the inactive surface of the semiconductor chip and top surface of the heat dissipation section from the encapsulant. The chip carrier is one of a substrate and a leadframe.

Through the aforesaid fabrication method, a heat dissipation package structure is disclosed according to the present invention, which comprises: a chip carrier; a semiconductor chip having an active surface and a relative inactive surface, the semiconductor chip being mounted on and electrically connected to the chip carrier through its active surface; a heat dissipation member, which has a heat dissipation section, a supporting section extending downward from the heat dissipation section, and an opening formed in the heat dissipation section, wherein, the heat dissipation member is supported on the chip carrier through the supporting section, the semiconductor chip is received in the space formed by the heat dissipation section and the supporting section, and top surface of the heat dissipation section is flush with the inactive surface of the semiconductor chip; and an encapsulant formed on the chip carrier for encapsulating the semiconductor chip and the heat dissipation member, the inactive surface of the semiconductor chip and the top surface of the heat dissipation section being exposed from the encapsulant.

In view of the above, the heat dissipation package structure and method for fabricating the same according to the present invention mainly comprise mounting and electrically connecting a semiconductor chip to a chip carrier by means of flip chip; mounting a heat dissipation member having a heat dissipation section and a supporting section extending downward from the heat dissipation section on the chip carrier, wherein, an opening corresponding to the semiconductor chip is formed in the heat dissipation section such that the semiconductor chip can be received in the space formed by the heat dissipation section and the supporting section, and the opening of the heat dissipation section is corresponding to the inactive surface of the semiconductor chip; next, forming an encapsulant to encapsulate the semiconductor chip and the heat dissipation member, and thinning the encapsulant to expose the inactive surface of the semiconductor chip and top surface of the heat dissipation section from the encapsulant. Accordingly, a heat dissipation package structure with surface of the semiconductor chip exposed from the encapsulant is fabricated through simple fabrication process at low cost. Besides, according to the fabrication process of the present invention, the encapsulant is formed to encapsulate the semiconductor chip and the heat dissipation member first, and then a thinning process is performed to expose the inactive surface of the semiconductor chip and the heat dissipation member, thereby avoiding chip damage caused by pressing force during the package molding process.

BRIEF DESCRIPTION OF DRAWINGS

The present invention can be more fully understood by reading the following detailed description of the preferred embodiments, with reference made to the accompanying drawings, wherein.

DETAILED DESCRIPTION OF PREFERRED EMBODIMENTS

The following illustrative embodiments are provided to illustrate the disclosure of the present invention, these and other advantages and effects can be apparently understood by those in the art after reading the disclosure of this specification. The present invention can also be performed or applied by other different embodiments. The details of the specification may be on the basis of different points and applications, and numerous modifications and variations can be devised without departing from the spirit of the present invention.

First Embodiment

Please refer to FIGS. 5A through 5E, which are diagrams showing a heat dissipation package structure and method for fabricating the same according to a first embodiment of the present invention.

Figure 1A:
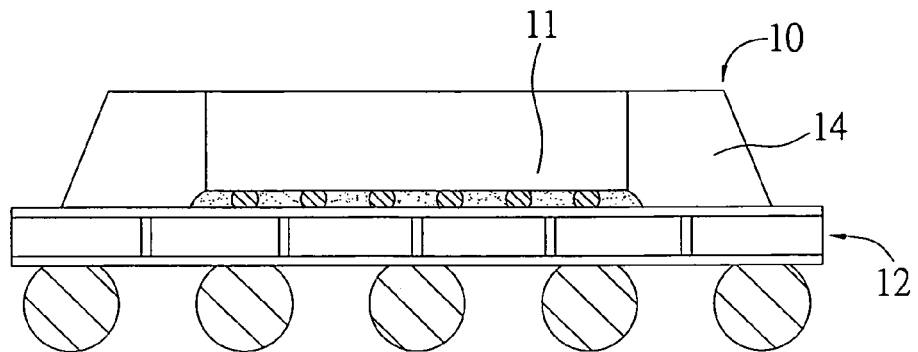
FIGS. 1A and 1B are cross-sectional diagrams of a semiconductor package according to U.S. Pat. No. 5,450,283.
Figure 1B:
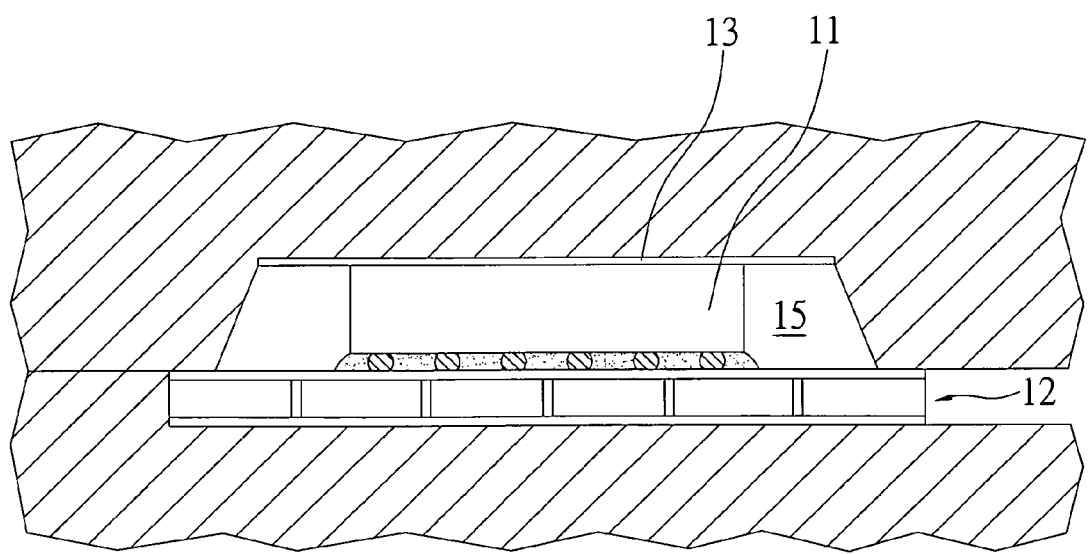
Figure 2A:
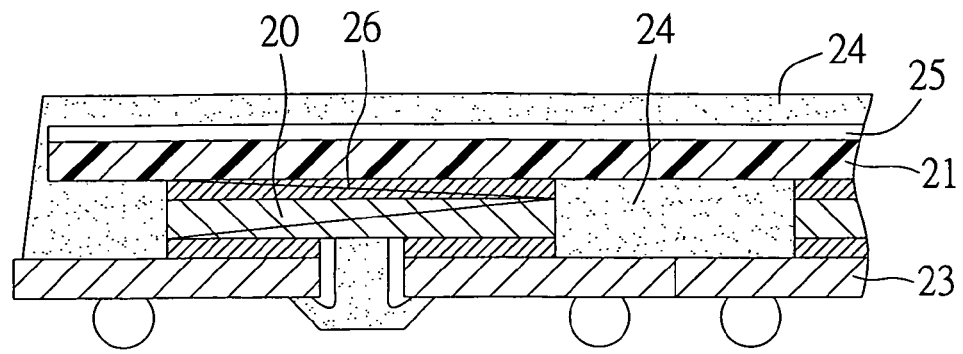
FIGS. 2A through 2C are cross-sectional diagrams of a semiconductor package according to U.S. Pat. No. 6,458,626.
Figure 2B:
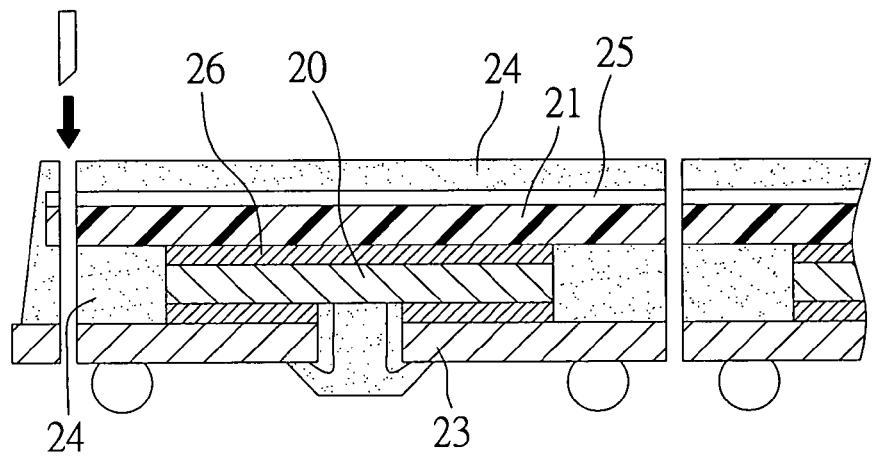
Figure 2C:
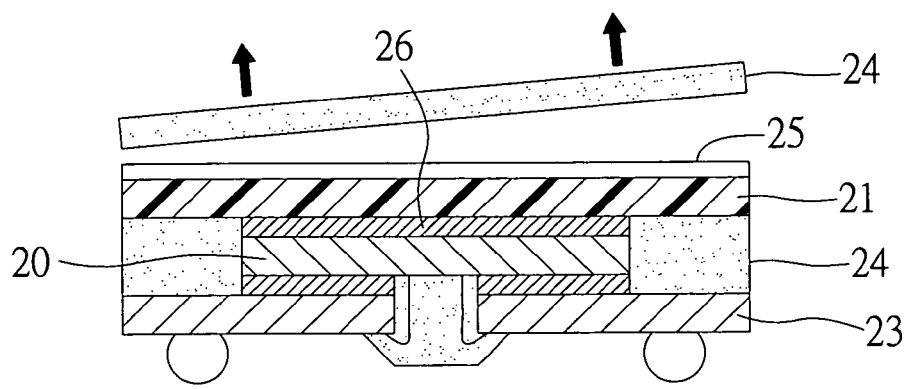
Figure 3:
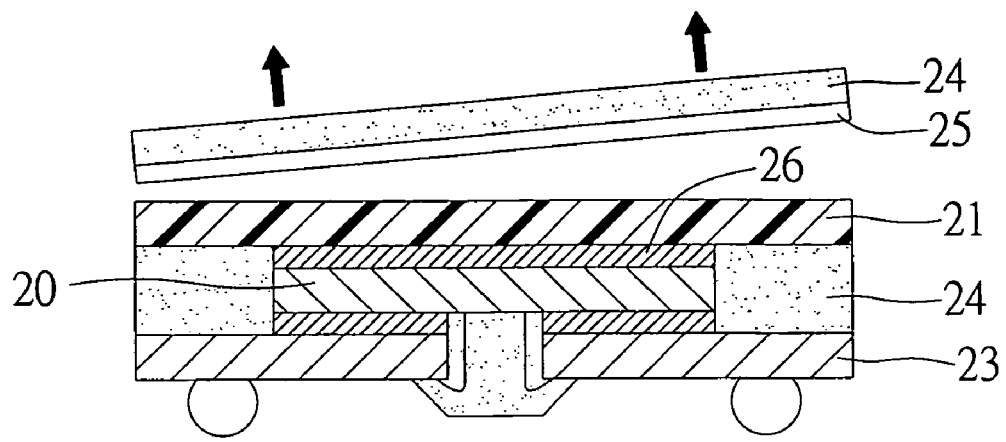
FIG. 3 is a cross-sectional diagram of a semiconductor package according to U.S. Pat. No. 6,444,498.
Figure 4:
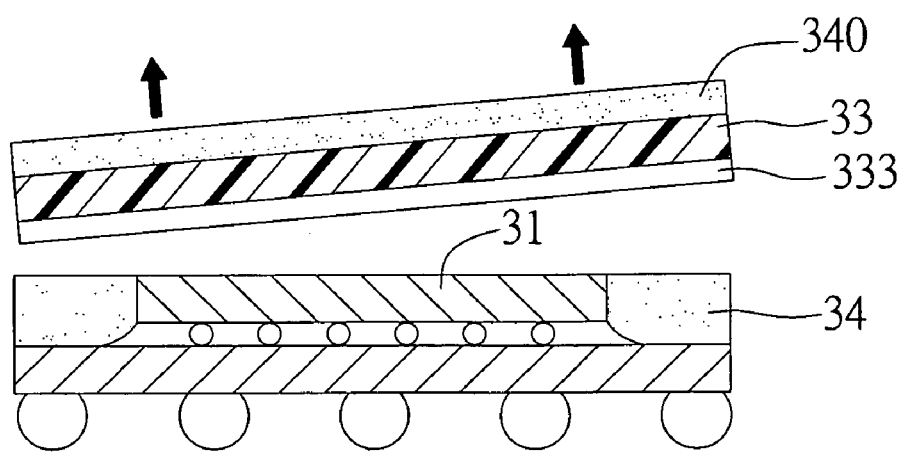
FIG. 4 is a cross-sectional diagram of a semiconductor package according to U.S. Pat. No. 6,699,731.
Figure 5A:
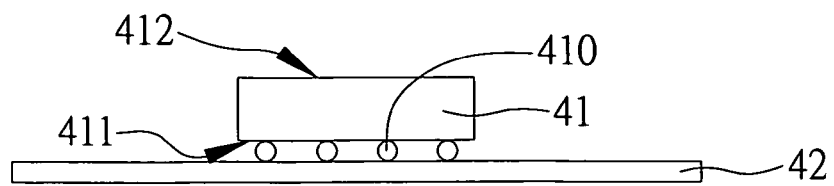
FIGS. 5A through 5E are diagrams showing a heat dissipation package structure and method for fabricating the same according to a first embodiment of the present invention.

As shown in FIG. 5A, at least a semiconductor chip 41 that has an active surface 411 and a relative inactive surface 412 is mounted on and electrically connected to a chip carrier 42. The chip carrier 42 is a ball grid array (BGA) substrate or a land grid array (LGA) substrate. The semiconductor chip 41 is, for instance, a flip chip semiconductor chip, which is electrically connected to the chip carrier 42 through its active surface 411 via a plurality of conductive bumps 410.

Figure 5B:
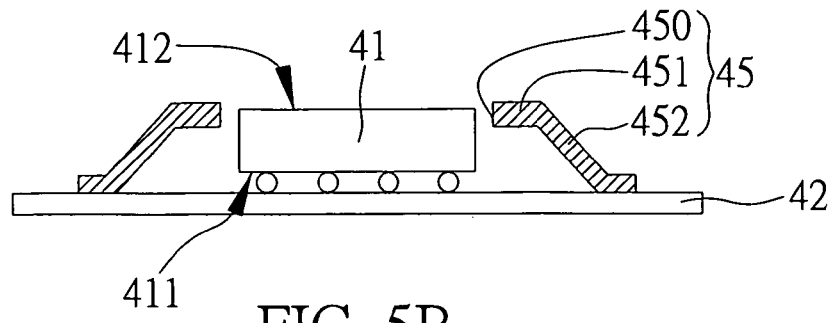

As shown in FIG. 5B, a heat dissipation member 45 is mounted on the chip carrier 42. The heat dissipation member 45 has a heat dissipation section 451, a supporting section 452 that extends downward from the heat dissipation section 451, and an opening 450 formed in the heat dissipation section 451, wherein, the heat dissipation member 45 is supported on the chip carrier 42 through the supporting section 452, and the semiconductor chip 41 is received in the space formed by the heat dissipation section 451 and the supporting section 452, and the semiconductor chip 41 corresponds to the position of the opening 450 of the heat dissipation section 451. Size of the opening 450 of the heat dissipation section 451 is greater than planar size of the semiconductor chip 41, and surface of the heat dissipation section 451 is slightly higher than the inactive surface 412 of the semiconductor chip 41.

Figure 5C:
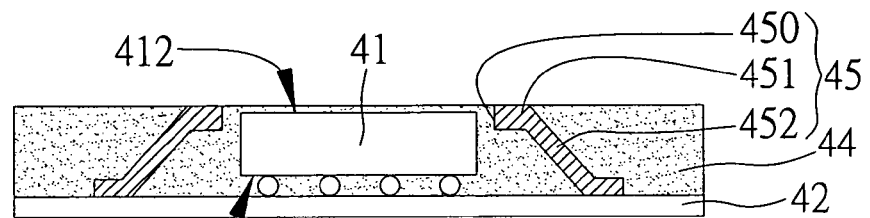

As shown in FIG. 5C, a package molding process is performed, the integrated structure comprising the semiconductor chip 41, the heat dissipation member 45, and the chip carrier 42 is disposed inside a mold cavity of an encapsulation mold, not shown in the drawing, and a package resin is filled therein. Then, the encapsulation mold is removed and an encapsulant 44 that encapsulates the semiconductor chip 41 and the heat dissipation member 45 is formed on the chip carrier 42, wherein, surface of the heat dissipation section 451 is slightly higher than the inactive surface 412 of the semiconductor chip 41, thereby preventing crack of the semiconductor chip from occurring when the encapsulation mold is directly abutted against the semiconductor chip in the prior art.

Figure 5D:
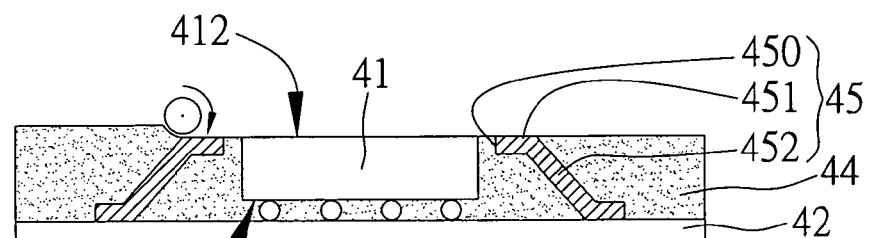
Figure 5E:
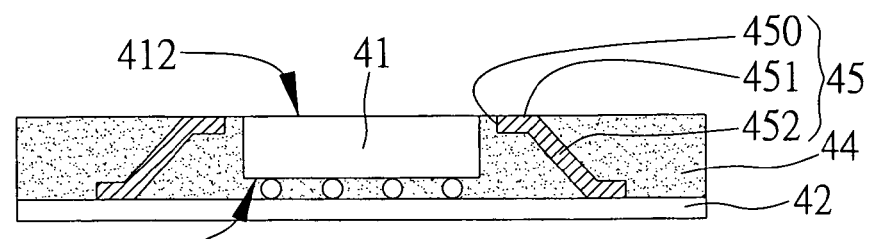

As shown in FIGS. 5D and 5E, by means of a thinning process such as grinding, the encapsulant 44 located on the inactive surface 412 of the semiconductor chip 41 and part of the heat dissipation section 451 of the heat dissipation member 45 is removed to expose the inactive surface 412 of the semiconductor chip 41 and top surface of the heat dissipation section 451 of the heat dissipation member 45 from the encapsulant 44, thereby providing the semiconductor chip 41 with a better heat dissipation path.

Through the aforesaid fabrication method, a heat dissipation package structure is further disclosed according to the present invention, which comprises: a chip carrier 42; a semiconductor chip 41 having an active surface 411 and a relative inactive surface 412, the semiconductor chip 41 being mounted on and electrically connected to the chip carrier 42 through its active surface 411; a heat dissipation member 45 having a heat dissipation section 451, a supporting section 452 extending downward from the heat dissipation section 451, and an opening 450 formed in the heat dissipation section 451, wherein, the heat dissipation member 45 is supported on the chip carrier 42 through the supporting section 452, the semiconductor chip 41 is received in the space formed by the heat dissipation section 451 and the supporting section 452, and the top surface of the heat dissipation section 451 is flush with the inactive surface 412 of the semiconductor chip 41; and an encapsulant 44 formed on the chip carrier 42 for encapsulating the semiconductor chip 41 and the heat dissipation member 45, the inactive surface 412 of the semiconductor chip 41 and the top surface of the heat dissipation section 451 being exposed from the encapsulant 44. Therefore, heat generated by the semiconductor chip 41 during operating is capable of being efficiently dissipated into the air.

Second Embodiment

Figure 6:
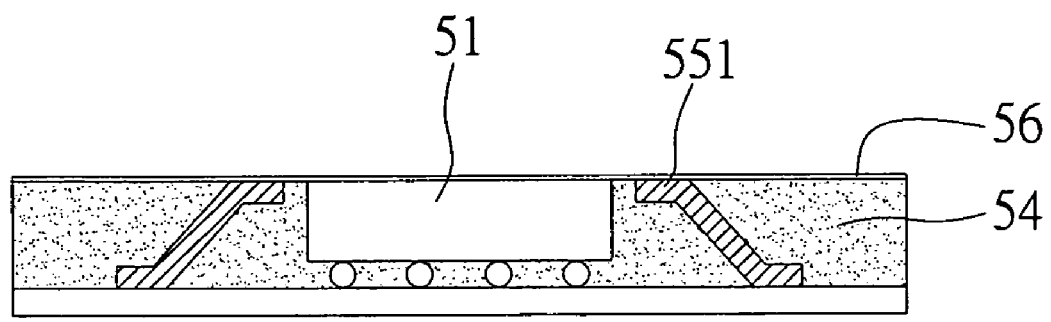
FIG. 6 is a diagram of a heat dissipation package structure according to a second embodiment of the present invention.

Please refer to FIG. 6, which is a diagram of a heat dissipation package structure according to a second embodiment of the present invention. As shown in the drawing, the heat dissipation package structure of the present embodiment is mostly similar to that of the first embodiment, a main difference therebetween is after the encapsulant on the semiconductor chip 51 is removed, a passivation layer 56, made of such as ink is coated on the top surface of the heat dissipation section 551 exposed from the encapsulant 54 to prevent the heat dissipation section 551 from becoming oxidized.

In view of the above, the heat dissipation package structure and method for fabricating the same of the present invention mainly comprise mounting and electrically connecting a semiconductor chip to chip carrier by means of flip chip; mounting a heat dissipation member having a heat dissipation section and a supporting section extending downward from the heat dissipation section on the chip carrier, wherein, an opening corresponding to the semiconductor chip is formed in the heat dissipation section such that the semiconductor chip can be received in the space formed by the heat dissipation section and the supporting section, and the opening of the heat dissipation section corresponds to the inactive surface of the semiconductor chip; next, forming an encapsulant to encapsulate the semiconductor chip and the heat dissipation member, and thinning the encapsulant to expose the inactive surface of the semiconductor chip and top surface of the heat dissipation section from the encapsulant. Accordingly, a heat dissipation package structure with surface of the semiconductor chip exposed from the encapsulant is fabricated through simple fabrication process at low cost. Besides, according to the fabrication process of the present invention, the encapsulant is formed to encapsulate the semiconductor chip and the heat dissipation member first, and then a thinning process is performed to expose the inactive surface of the semiconductor chip and the heat dissipation member, thereby avoiding chip damage caused by pressing force during the package molding process.

The foregoing descriptions of the detailed embodiments are only illustrated to disclose the features and functions of the present invention and not restrictive of the scope of the present invention. It should be understood to those in the art that all modifications and variations according to the spirit and principle in the disclosure of the present invention should fall within the scope of the appended claims.

What is claimed is:

1. A heat dissipation package structure, comprising:
   a chip carrier;
   a semiconductor chip having an active surface and a relative inactive surface, the semiconductor chip being mounted on and electrically connected to the chip carrier through the active surface;
   a heat dissipation member having a heat dissipation section, a supporting section extending downward from the heat dissipation section, and an opening formed in the heat dissipation section, wherein, the heat dissipation member is supported on the chip carrier through the supporting section, the semiconductor chip is received in the space formed by the heat dissipation section and the supporting section, and top surface of the heat dissipation section is flush with the inactive surface of the semiconductor chip; and
   an encapsulant formed on the chip carrier for encapsulating the semiconductor chip and the heat dissipation member, the inactive surface of the semiconductor chip and the top surface of the heat dissipation section being exposed from the encapsulant.

2. The heat dissipation package structure of claim 1, wherein, the chip carrier is one of a substrate and a leadframe.

3. The heat dissipation package structure of claim 1, wherein, the chip carrier is one of a ball grid array (BGA) substrate and a land grid array (LGA) substrate.

4. The heat dissipation package structure of claim 1, wherein the semiconductor chip is electrically connected to the chip carrier through the active surface via a plurality of conductive bumps.

5. The heat dissipation package structure of claim 1, wherein, size of the opening of the heat dissipation section is greater than planar size of the semiconductor chip.

6. The heat dissipation package structure of claim 1 further comprising a passivation layer formed on the top surface of the heat dissipation section exposed from the encapsulant.

7. The heat dissipation package structure of claim 6, wherein, the passivation layer is made of ink.

* * * * *